(12) United States Patent
Carberry

(10) Patent No.: US 9,908,282 B2
(45) Date of Patent: Mar. 6, 2018

(54) METHOD FOR PRODUCING A SEMICONDUCTOR USING A VACUUM FURNACE

(71) Applicant: Mossey Creek Technologies Inc., Jefferson City, TN (US)

(72) Inventor: John Carberry, Talbott, TN (US)

(73) Assignee: Mossey Creek Technologies, Inc., Jefferson City, TN (US)

(*) Notice: Subject to any disclaimer, the term of this patent is extended or adjusted under 35 U.S.C. 154(b) by 794 days.

(21) Appl. No.: 14/253,514

(22) Filed: Apr. 15, 2014

(65) Prior Publication Data

US 2014/0306368 A1   Oct. 16, 2014
US 2017/0103886 A9   Apr. 13, 2017

Related U.S. Application Data

(63) Continuation-in-part of application No. 13/236,391, filed on Sep. 19, 2011, now Pat. No. 8,765,036, which
(Continued)

(51) Int. Cl.
  *B29C 51/36* (2006.01)
  *H01L 21/02* (2006.01)
  (Continued)

(52) U.S. Cl.
  CPC ............ *B29C 51/36* (2013.01); *C30B 11/002* (2013.01); *C30B 29/06* (2013.01); *C30B 29/64* (2013.01); *H01L 21/02035* (2013.01); *H01L 31/1804* (2013.01); *Y02E 10/547* (2013.01); *Y02P 70/521* (2015.11)

(58) Field of Classification Search
  CPC .. H01L 21/02035; C30B 11/002; B29C 51/36
  See application file for complete search history.

(56) References Cited

U.S. PATENT DOCUMENTS

| 4,624,862 A | 11/1986 | Yang et al. |
| 4,803,183 A | 2/1989 | Schwetz et al. |

(Continued)

FOREIGN PATENT DOCUMENTS

| CN | 101244823 | 8/2008 |
| JP | 01125924 A * | 5/1989 |

(Continued)

OTHER PUBLICATIONS

Abstract of JP 01125924.*

*Primary Examiner* — Christopher Schatz
(74) *Attorney, Agent, or Firm* — Pitts & Lake, P.C.

(57) ABSTRACT

A method of manufacturing a semiconductor includes providing a mold defining a planar capillary space; placing a measure of precursor in fluid communication with the capillary space; creating a vacuum around the mold and within the planar capillary space; melting the precursor; allowing the melted precursor to flow into the capillary space; and cooling the melted precursor within the mold such that the precursor forms a semiconductor, the operations of melting the precursor, allowing the precursor to flow into the capillary space, and cooling the melted precursor occurring in the vacuum.

13 Claims, 1 Drawing Sheet

Related U.S. Application Data is a continuation-in-part of application No. PCT/US2011/037899, filed on May 25, 2011, and a continuation-in-part of application No. PCT/US2011/037900, filed on May 25, 2011.

(60) Provisional application No. 61/812,078, filed on Apr. 15, 2013, provisional application No. 61/347,904, filed on May 25, 2010, provisional application No. 61/406,755, filed on Oct. 26, 2010, provisional application No. 61/442,016, filed on Feb. 11, 2011.

(51) Int. Cl.
*C30B 11/00* (2006.01)
*C30B 29/06* (2006.01)
*C30B 29/64* (2006.01)
*H01L 31/18* (2006.01)

(56) References Cited

U.S. PATENT DOCUMENTS

| | | |
|---|---|---|
| 4,877,759 A | 10/1989 | Holt |
| 4,908,173 A | 3/1990 | Schwetz et al. |
| 5,049,367 A | 9/1991 | Nakano et al. |
| 5,165,983 A | 11/1992 | Sugiura et al. |
| 5,427,601 A | 6/1995 | Harada et al. |
| 5,431,869 A | 7/1995 | Kumar et al. |
| 5,654,246 A | 8/1997 | Newkirk et al. |
| 6,013,236 A | 1/2000 | Takahesi |
| 6,902,699 B2 | 6/2005 | Fritzemeier et al. |
| 7,344,675 B2 | 3/2008 | Van Daam et al. |
| 7,354,490 B2 | 4/2008 | Fritzemeier et al. |
| 7,604,696 B2 | 10/2009 | Carberry |
| 7,604,896 B2 | 10/2009 | Carberry |
| 7,922,841 B2 | 4/2011 | Bampton |
| 2002/0125402 A1 | 9/2002 | Cordes et al. |
| 2004/0048411 A1 | 3/2004 | Nishida |
| 2005/0145176 A1 | 7/2005 | Wicker |
| 2006/0142143 A1 | 6/2006 | Abrevaya et al. |
| 2006/0219162 A1* | 10/2006 | Parthasarathy ....... C30B 11/002 117/208 |
| 2008/0153688 A1 | 6/2008 | Borens et al. |
| 2008/0233720 A1 | 9/2008 | Carberry |
| 2009/0120493 A1 | 5/2009 | Sinha |
| 2009/0191112 A1 | 7/2009 | Moon et al. |
| 2009/0250103 A1 | 10/2009 | Katoh et al. |
| 2010/0059107 A1 | 3/2010 | Barnett et al. |
| 2010/0084776 A1 | 4/2010 | Murokono et al. |

FOREIGN PATENT DOCUMENTS

| | | |
|---|---|---|
| JP | 11-54805 | 2/1999 |
| WO | WO 2004/055909 | 7/2004 |
| WO | WO 2006/107769 | 10/2006 |
| WO | WO 2010/092972 | 8/2010 |
| WO | WO 2102/033303 | 3/2012 |
| WO | WO 2012/067327 | 5/2012 |

* cited by examiner

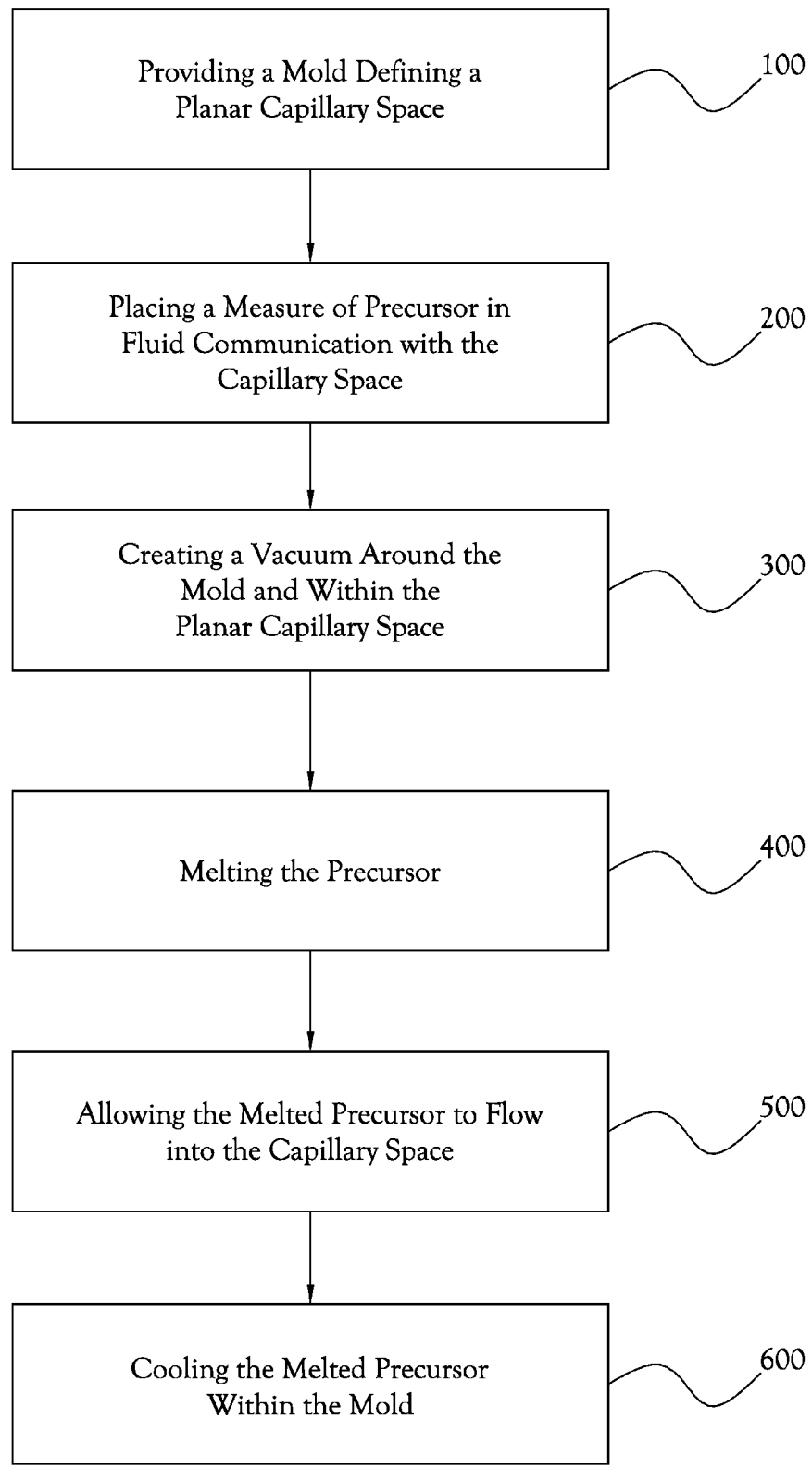

METHOD FOR PRODUCING A SEMICONDUCTOR USING A VACUUM FURNACE

CROSS-REFERENCE TO RELATED APPLICATIONS

This Application claims the benefit of and priority to U.S. Provisional Patent Application Ser. No. 61/812,078, filed Apr. 15, 2013; and is a continuation-in-part of U.S. patent application Ser. No. 13/236,391, filed Sep. 19, 2011; which claims the benefit of U.S. Provisional Patent Application No. 61/347,904, filed on May 25, 2010; U.S. Provisional Patent Application No. 61/406,755, filed on Oct. 26, 2010; U.S. Provisional Patent Application No. 61/442,016, filed on Feb. 11, 2011; International Patent Application No. PCT/US2011/037899, filed on May 25, 2011; and International Patent Application No. PCT/US2011/037900, filed on May 25, 2011. The contents of each of the foregoing applications are herein incorporated in their entireties by reference.

STATEMENT REGARDING FEDERALLY SPONSORED RESEARCH OR DEVELOPMENT

Not Applicable

BACKGROUND OF THE INVENTION

1. Field of Invention

The present general inventive concept relates to the preparation of silicon-based semiconductor materials.

2. Description of the Related Art

The vast majority of wafers for solar cells for photovoltaic devices are made by processes which add substantial costs and impart defects that significantly reduce performance. Virtually all wafers are made by "wire sawing" wafers from larger ingots or blocks of silicon. The wire sawing has several defects and cost and yield elements. The vibration in the wire sawing action causes micro-cracks in the wafer which diminishes efficiency, causes downstream failure from subsequent cracking; these micro cracks are typically 15-25 microns deep from both sides. As the wafer is processed in downstream in line processing and assembly and shipping these stresses can put a moment on the crack and propagate a crack, which is especially costly as value is added to the wafer as a cell, as a module and even as it is installed making this defect very expensive. The wire sawing is expensive in labor and in expendables and amortization of expensive equipment. The "yield losses" of silicon from the wire sawing, including the cleaning of the ingot, the machining of the "loaves" and the losses from wire sawing often approach or exceed 70%. The inescapable micro cracks limit how thin the wafers can be made, thus forcing the industry to use wafers thicker than otherwise desired.

Virtually all the ingots prepared for machining are made by one of two processes. Multigrain silicon ingots made by melting silicon in crucibles constructed of rebonded fused silica. These rebonded fused silica crucibles are fabricated from glass quality silica sand containing 350 ppm Fe2O3. The sand is melted and then ground slip cast into the desired shape and the rebonded, thus putting the Fe2O3 into solution. The crucible is then filled with lumps of solar grade silicon, 7-9 nines pure, and melted in a furnace in a vacuum with a low grade vacuum and kept at temperature for about 56 hours. During this time about 80% of the volume of silica in the crucible transforms from amorphous silica to a crystalline form called cristobalite, the cristobalite precipitating in a pure form and thus zone refining the now iron rich glass into the grain boundaries which flows and rapidly defuses throughout the silicon melt. As well, the silicon steals oxygen from the crucible, and carbon monoxide in the atmosphere reacts with the silicon as well. This results in much reduced efficiency in the resulting solar cells along with a large volume of silicon cleaned from all surfaces because of the contamination therein from carbon and oxygen.

Single crystal ingots made by the Czochralski process by drawing a crystal from a liquid pool of silicon held in an essentially pure quartz crucible. The quartz in this case is much purer than the rebonded fuses silica crucible, but there is much more flow of silicon in the crucible resulting in large amounts of oxygen distributed throughout the ingot thus reducing efficiency.

Because of the rates of diffusion in the silicon melts and the length of time at temperature, it is not possible to dope with boron, phosphorous or arsenic and maintain doping precision and accuracy required. For this reason, an N type wafer has not been possible despite its advantages.

For these reasons these technical approaches have been compromised by very low yield on silicon, often 30% or less; very high costs for one use crucibles; high cost from long times and large masses at high temperature; high costs from wire sawing and its associated processes; low yield from downstream and in process failure from micro cracking; low efficiency due to contamination from processing; and an inability to make a very thin wafer.

In the field of fabricating silicon semiconductor wafers, there is a need for methods and processes that increase in yield on silicon to 90% or higher from 30% or lower, maintain very high purity resulting in higher efficiency, and display an ability to make very thin wafers, as thin as less than 50 microns, thus potentially reducing the silicon per wafer by as much as 88% compared to current practices. It is also desirable to eliminate micro cracks and downstream and in process failures, reduce labor and energy costs, and move beyond expensive single-use crucibles.

BRIEF SUMMARY OF THE INVENTION

The present invention, in some of its several embodiments, comprises semiconductor materials and methods and processes for making the same. In some embodiments, the semiconductor materials include silicon milled according to a process taught by U.S. Pat. No. 6,638,491.

In some example embodiments according to the present general inventive concept, a method of manufacturing a semiconductor includes providing a mold defining a planar capillary space; placing a measure of precursor in fluid communication with the capillary space; creating a vacuum around the mold and within the planar capillary space; melting the precursor; allowing the melted precursor to flow into the capillary space; and cooling the melted precursor within the mold such that the precursor forms a semiconductor, the operations of melting the precursor, allowing the precursor to flow into the capillary space, and cooling the melted precursor occurring in the vacuum.

In some embodiments, the vacuum is of an atmospheric pressure less than or equal to 200 microns of mercury.

In some embodiments, the vacuum is of an atmospheric pressure less than or equal to 0.2 microns of mercury In some embodiments, the vacuum is sufficient to reduce the molecules of oxygen in a liter of space by 99.999978% of standard atmosphere.

In some embodiments, the vacuum is sufficient to reduce the number of molecules of oxygen in a liter of space from $3.18 \times 10^{21}$ to $8.36 \times 10^{14}$.

In some embodiments, the operations of melting the precursor, allowing the precursor to flow into the capillary space, and cooling the melted precursor occur in a vacuum furnace.

In some embodiments, the method further includes placing the mold containing the precursor in the vacuum furnace; purging the vacuum furnace with argon; evacuating the vacuum furnace to a pressure less than or equal to 0.2 microns of mercury; and again purging the vacuum furnace with argon, each of the steps of purging the vacuum furnace with argon, evacuating the vacuum furnace to a pressure less than or equal to 0.2 microns of mercury, and again purging the vacuum furnace with argon occurring prior to melting the precursor.

In some embodiments, the precursor comprises silicon.

In some embodiments, the silicon is at least 99.99% pure.

In some embodiments, the silicon is at least 99.99999% pure.

In some embodiments, the silicon is at least 99.9999999% pure.

In some embodiments, the mold is fabricated from graphite.

In some embodiments, the graphite mold is covered with a material that is substantially non-reactive to the precursor powder.

In some embodiments, the non-reactive material is silicon nitride.

In some embodiments, the method also includes adding a dopant to the precursor prior to melting.

In some embodiments, the dopant is selected from the group consisting of arsenic, phosphorous, boron, and gallium.

In some embodiments, a tool for shaping a semiconductor wafer includes a tool body fabricated from a material selected to be nonreactive with silicon, said tool body having a surface finish of such fineness that the expansion of silicon upon cooling does not substantially damage the tool body.

In some embodiments, the tool body includes silicon carbide or silicon nitride.

In some embodiments, the tool body includes graphite coated with silicon carbide or silicon nitride.

In some embodiments, the tool body includes graphite coated with a CVB coating of silicon carbide or silicon nitride or with a PVD coating of silicon carbide or silicon nitride.

BRIEF DESCRIPTION OF THE SEVERAL VIEWS OF THE DRAWINGS

The above-mentioned features and other aspects of the invention will become more clearly understood from the following detailed description of the invention read together with the drawings in which:

FIG. 1 is a flow diagram of an example embodiment of a process for fabricating a silicon-based semiconductor material.

DETAILED DESCRIPTION OF THE INVENTION

Disclosed herein are silicon-based semiconductor materials and methods for making the same. In some embodiments, the semiconductor materials include silicon milled according to a process taught by U.S. Pat. No. 6,638,491.

In some example embodiments of the present invention, the target silicon wafer must be thin (the current standard is about 150 microns). It is expected that a thinner wafer would offer advantages, including lower cost for silicon. In order to melt silicon and make a wafer thinner than 500 microns (below which thickness free standing silicon will form balls due to the battle between surface energy and gravity) one must create a capillary space to "trap" the liquid silicon in a tool which can freeze the silicon in the desired thickness, planer, parallel, and free of contaminants—otherwise the silicon will form balls and not flow into a wafer. In this case a two part tool, the bottom having a dwell depth into which the silicon grains or powders are "charged" and the lid having a protruding area less than the x and y dimensions of the dwell in the bottom, and representing the net shape of the wafer's x and y dimensions, both surface being essentially flat and true. In the preferred design, the two surfaces would sit on each other, the charged powder interfering with this fit till the silicon was melted and trapped between the two surfaces. The liquid silicon is thus "trapped" in the capillary space defined by these two surfaces.

Graphite is the preferred material of construction for this tooling, and because graphite and silicon will react to form Silicon Carbide, one must coat the graphite to avoid this reaction between the graphite and the silicon. There are many refractory coatings, but silicon is a very reactive material, especially at temperatures in the range of its melting point, and many coatings will offer up contaminants. For instance boron nitride, aluminum nitride and titanium nitride will all contaminate the silicon with their metal much to the detriment of the silicon's photovoltaic performance. As a result we have found that a coating of silicon nitride works best;

Silicon is a hungry "getter" of oxygen. In order to melt fast and in the capillary space it is necessary to "charge" the tool described in a) and said tool coated as described in b) with relatively small pieces or grains or powders of silicon. This is also necessary such that as soon as the silicon melts it is trapped in the capillary space. It has been found that very low levels of oxygen will oxidize the surfaces of such small pieces of silicon. Also, there is also present in the atmosphere carbon monoxide, which will both oxidize the surface of the silicon and form silicon carbide. This can form a "skin" which will retain its shape to very high temperatures. In such a case, unless one raises the temperature to levels very much in excess of the melting point of silicon, the silicon will melt in the center and the skin formed of SiO and SiC will retain its shape and prevent the liquid silicon from flowing and forming a wafer in the capillary space.

Given the design of the tools and the materials of construction very common to these furnaces and tools, often or nearly always including carbon or graphite, there are normally several sources of oxygen, being carbon monoxide or carbon dioxide, silicon monoxide or dioxide, oxygen and the like. In the case of the silicon stealing oxygen from the extant carbon oxide gas, this is doubly lethal to our process as it will form both silicon oxide and silicon carbide on the surface of the particles. Raising the temperature to such high levels above the melting point creates many problems, including contamination especially. So one must control the oxygen and partial pressure of oxygen and constituents such as carbon monoxide to very low levels, such low levels that the surface area of silicon and graphite and carbon presents many times more atoms than is present in the atmosphere.

Some embodiments of the present general inventive concept include a method for making a net shape silicon wafer for photovoltaic solar cells which has very low contamination, is essentially free of oxides, and can be made very thin. The example embodiment method includes melting silicon grains or powders (generally less than 12 mm in diameter, optimally 3 mm or less). With proper control of oxygen levels in the melting furnace, the materials are milled in an attrition mill under ethanol and formed into micron or sub-microns sized particulates, which allow the tool to be loaded with silicon in very intimate contact and in a form of bulk density much closer in packing to the final size, shape and density of the wafer, allowing much quicker melting and filling and trapping of the silicon in the capillary space. The silicon particulates are either milled pure (that is, by themselves) or milled with a dopant selected to make the body of the wafer an n-type semiconductor (for which the dopant would be, e.g., phosphorous or arsenic) or a p-type semiconductor (for which the dopant would be, e.g., boron). In a tool, preferably graphite or a similar material, which has a first part, a bottom having a cavity in it, said cavity being larger than the length and width of the desired wafer (most wafers being square), fabricated to be essentially flat and parallel, and a second member, being a lid, with a proud member being smaller than the length and width of the cavity of the first member but the approximate size of the desired wafer, said two members being fabricated so that the lid can be centered in the cavity, and the two surfaces can be in contact when the lid is placed in the cavity, said tool being coated or treated or of such material that will not react or contaminate with the silicon, the preferred coating for graphite being silicon nitride.

Some embodiments of the present general inventive concept include a tool fabricated of a material that is non-reactive with respect to silicon, for instance silicon carbide or $Si_3N_4$. The tool of non-reactive material must have a surface finish so fine that the expansion of silicon upon freezing (about 9-10%) will not damage the tool (which would limit its effective life).

Some embodiments include a tool of monolithic silicon carbide or $Si_3N_4$ with such a surface finish as described above.

Some embodiments include a tool of graphite coated with silicon carbide or $Si_3N_4$, the tool such a surface finish as described above.

The silicon particulates, with or without dopants, are processed at a temperature in excess of the melting point of the prepared silicon, in an atmosphere with significantly reduced oxygen from any source, including $CO$, $CO_2$, $SiO$, $SiO_2$, $O_2$, and others. The level of oxygen available to react with the silicon should be reduced, in some preferred embodiments to significantly less than $10^{17}$ molecules of oxygen per liter, preferably $10^{14}$ molecules per liter or less (or, to put it another way, the number of atoms of silicon and graphite in the system should vastly outnumber the number of atoms of oxygen). A vacuum has been shown to work. In this case a 0.2 micron vacuum reduces the molecules of oxygen in a liter of space by 99.999978%, which means the oxygen in a liter of space is reduced from $3.18 \times 10^{21}$ to $8.36 \times 10^{14}$. At the same time, in a typical environment the number of atoms of silicon and graphite available for reaction might be $10^{21}$ or much more, meaning that very little of the silicon is oxidized to make SiO or reacted with carbon to make SiC.

In the preferred embodiment, the melting atmosphere is created by using a vacuum furnace, first purged with argon, then at a low temperature before oxygen can react with carbon, evacuated to a typical level of pressure equal to 0.2 microns of mercury, where the atmosphere is then purged with argon again before the melting point of silicon is achieved, thus allowing one to operate at a higher temperature and maintain control of the vapor pressure of the liquid silicon.

In some example embodiments of the present general inventive concept, silicon is milled according to a method disclosed in U.S. Pat. No. 6,638,491, issued to Carberry. In such a case the use of this technology is helpful in that it provides for a safe cost effective way to mill silicon.

Turning to FIG. 1, in some example embodiments of the present general inventive concept, a method of manufacturing a semiconductor includes providing a mold defining a planar capillary space 100; placing a measure of precursor in fluid communication with the capillary space 200; creating a vacuum around the mold and within the planar capillary space 300; melting the precursor 400; allowing the melted precursor to flow into the capillary space 500; and cooling the melted precursor within the mold 600, such that the precursor forms a semiconductor, the operations of melting the precursor, allowing the precursor to flow into the capillary space, and cooling the melted precursor occurring in the vacuum.

While the present invention has been illustrated by description of several embodiments and while the illustrative embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept.

What is claimed is:

1. A method of manufacturing a semiconductor, the method comprising:
   providing a mold defining a planar capillary space;
   placing a measure of precursor in fluid communication with the planar capillary space;
   creating a vacuum around the mold and within the planar capillary space within a vacuum furnace;
   purging the vacuum furnace with argon;
   evacuating the vacuum furnace to a pressure less than or equal to 0.2 microns of mercury;
   again purging the vacuum furnace with argon;
   again evacuating the vacuum furnace to a pressure less than or equal to 0.2 microns of mercury;
   melting the precursor;
   allowing the melted precursor to flow into the capillary space; and
   cooling the melted precursor within the mold such that the precursor forms a semiconductor, where
      the melting the precursor, the allowing the precursor to flow into the capillary space, and the cooling the melted precursor occur under the vacuum.

2. The method of claim 1 wherein the vacuum is sufficient to reduce molecules of oxygen in a liter of space by 99.999978% of standard atmosphere.

3. The method of claim 2 wherein the vacuum is sufficient to reduce the molecules of oxygen in a liter of space from $3.18 \times 10^{21}$ to $8.36 \times 10^{14}$.

4. The method of claim 3, wherein the melting the precursor, the allowing the precursor to flow into the capillary space, and the cooling the melted precursor occur in the vacuum furnace.

5. The method of claim 1 wherein the precursor comprises silicon.

6. The method of claim 5 wherein the silicon is at least 99.99% pure.

7. The method of claim 6 wherein the silicon is at least 99.99999% pure.

8. The method of claim 7 wherein the silicon is at least 99.9999999% pure.

9. The method of claim 1 wherein the mold is fabricated from graphite.

10. The method of claim 9 wherein the mold is covered with a material that is substantially non-reactive to the precursor.

11. The method of claim 10, the material being silicon nitride.

12. The method of claim 1 further comprising adding a dopant to the precursor prior to melting.

13. The method of claim 12, wherein the dopant is selected from the group consisting of arsenic, phosphorous, boron, and gallium.

* * * * *